United States Patent
Ott

(10) Patent No.: US 6,182,264 B1
(45) Date of Patent: Jan. 30, 2001

(54) SMART DYNAMIC SELECTION OF ERROR CORRECTION METHODS FOR DECT BASED DATA SERVICES

(75) Inventor: Stefan Ott, Munich (DE)

(73) Assignee: VLSI Technology, Inc., San Jose, CA (US)

(*) Notice: Under 35 U.S.C. 154(b), the term of this patent shall be extended for 0 days.

(21) Appl. No.: 09/083,642

(22) Filed: May 22, 1998

(51) Int. Cl.⁷ .................................................. H03M 13/35
(52) U.S. Cl. .............................................................. 714/774
(58) Field of Search ....................................... 714/774, 751

(56) References Cited

U.S. PATENT DOCUMENTS

| | | | |
|---|---|---|---|
| 4,979,174 | * 12/1990 | Cheng et al. | 371/41 |
| 5,699,365 | * 12/1997 | Klayman et al. | 371/5.5 |
| 5,729,557 | * 3/1998 | Gardner et al. | 371/41 |
| 5,761,223 | * 6/1998 | Ando et al. | 371/41 |
| 5,912,907 | * 6/1999 | Stewart | 371/41 |
| 5,926,232 | * 7/1999 | Mangold et al. | 348/845.1 |

OTHER PUBLICATIONS

Streit et al., "Dual–Mode Vector–Quantized Low–Rate Cordless Videophone Systems for Indoors and Outdoors Applications", IEEE Transactions on Vehicular Technology, vol. 46, No. 2, May 1997, pp. 340–357.*

* cited by examiner

Primary Examiner—Stephen M. Baker
(74) Attorney, Agent, or Firm—Wagner, Murabito & Hao LLP

(57) ABSTRACT

A dynamic error correction system for a bi-directional digital data transmission system. The transmission system of the present invention includes a transmitter adapted to encode information into a signal. A receiver receives the signal and decodes the information encoded thereon. The signal is transmitted from the transmitter to the receiver via a communications channel. A signal quality/error rate detector is coupled to the receiver and is adapted to detect a signal quality and/or an error rate in the information transmitted from the transmitter. The receiver is adapted to implement at least a first and second error correction process, depending upon the detected signal quality/error rate. The first error correction process is more robust and more capable than the second error correction process. The receiver coordinates the implemented error correction process with the transmitter via a feedback channel. The receiver dynamically selects the first or second error correction process for implementation in response to the detected signal quality/error rate and coordinates the selection with the transmitter such that error correction employed by the receiver and transmitter is tailored to the condition of the communications channel.

19 Claims, 4 Drawing Sheets

SMART DYNAMIC SELECTION OF ERROR CORRECTION METHODS FOR DECT BASED DATA SERVICES

TECHNICAL FIELD

The present invention relates generally to digital information systems. More particularly, the present invention relates to digital enhanced cordless telephony (DECT), and other error-prone bi-directional data transmission systems.

BACKGROUND ART

The transmission of digital information and data between systems has become an essential part of commonly used systems. With such systems, information content is transmitted and received in digital form as opposed to analog form. Information long associated with analog transmission techniques, for example, television, telephone, music, and other forms of audio and video, are now being transmitted and received in digital form. The digital form of the information allows signal processing techniques not practical with analog signals. In most applications, the user has no perception of the digital nature of the information being received.

Many digital communication devices (particularly wireless digital telephones) suffer some amount of signal degradation during the transmission from the originating device to the receiving device. This degradation often results in the loss of some information, some distortion in the signal, or some noticeable noise in the received signal (e.g., as in the case of a wireless telephone). Generally, the more frequent the errors, the more significant the loss of information at the receiving device, which consequently leads to more objectionable performance of the communications system.

To correct this problem, the electronics industry has adopted various error correction techniques which counteract the effects of signal degradation and improve or ensure the integrity of the information at the receiving device. Hence, many digital communications systems available on the market use error correction methods that are each able to accomplish reasonable communication quality under normal operating conditions.

Typically, error correction techniques function by including additional amounts of "redundant" information in the signal transmission from the originating device. This redundant information is often referred to as error correction code. The redundant information is used to check the validity of the information as received at the receiving device. For example, parity checking, check summing, cyclic redundancy checking, forward error correction coding, are several of the more widely used, well known error correction methods. These error correction methods help ensure the integrity of the received information, thereby ensuring the proper and error free operation of any applications being run on top of the received information, such as, for example, a wireless modem link supporting a remote network node.

The problem with the above error correction methods is that they reduce the available bandwidth of the signal transmission. With most digital communication systems, there is a very finite amount of spectrum allocated to the transmission channel. The transmission of redundant error correction code decreases the amount of bandwidth in the channel available for the transmission of the "real" information. When transmission conditions are bad, such as for example, during a thunderstorm or during periods of solar interference, the error correction methods are required for nominal operation. However, under good transmission conditions, error correction is not needed and available bandwidth is wasted transmitting error correction codes.

The unnecessary transmission of redundant information harms system efficiency. The wasted transmission of error correction codes is very undesirable where the bandwidth of the communications channel is very limited, as in digital wireless communication systems in high population density areas (e.g., cities). In addition to wasting bandwidth, unnecessary error correction wastes processor capacity in the receiving and transmitting devices. Signal processing effort is wasted encoding and decoding the error correction information, which in turn, needlessly slows the performance of the system and increases power consumption.

However, using current technology, error correction is still required in order to ensure the communications system will still function when signal transmission conditions are not good. Accordingly, the power and the amount of error correction used is typically chosen such that the communications system or the application being served by the communications system will run satisfactorily under average operating conditions. If a greater degree of reliability is required, the error correction used is chosen in view of worst case operating conditions.

These error correction methods are static in that they are typically chosen during the design process of the communications system. A static error correction method is chosen and designed into a communications system in accordance with the typical expected operating conditions of the system. Static error correction is, in this manner, a design compromise based upon the expected use of the system.

Thus, static assignment makes inefficient use of spectrum in case of good transmission conditions, or yields an unacceptable bit error rate under bad conditions. This is undesirable for wireless systems that are designed for and used to serve high population density. Very powerful error correction methods are available, but they involve more processor power than may actually be required under the circumstances, resulting in excess power consumption in the device. The additional signal processing also leads to increased transmission delay time.

Static assignment presents a special problem in the case of DECT/PHS/PCS/GSM and other wireless telecom systems operating under time-variant transmission conditions. The transmission conditions of the communications channel differ depending upon the time the communications system is being used. Consequently, the error correction method chosen for implementation is usually not the most efficient for any one particular circumstance. This forces trade offs and causes engineers to design for the worst case conditions. This also leads to wasted bandwidth.

Thus, what is needed is a method which tailors the error correction technique to the transmission conditions. What is required is a method which dynamically selects the type of error correction required depending upon the circumstances of the communications channel. What is required is a method which adjusts error correction according to the observed quality of the Flexibly adapting the error detection/correction method according to the observed signal transmission quality. In addition, the required solution should reduce the signal processing load needed for error correction as transmission conditions allow. The present invention provides a novel solution to the above requirements.

DISCLOSURE OF THE INVENTION

The present invention provides a method which tailors the error correction technique to the transmission conditions.

The present invention provides a method which dynamically selects the type of error correction required depending upon the circumstances of the communications channel. The method of the present invention adjusts error correction according to the observed quality of the communications channel, flexibly adapting the error detection/correction method according to the observed signal transmission quality. In addition, the present invention dynamically reduces the signal processing load needed for error correction, usage of communications channel bandwidth, and power consumption as transmission conditions allow.

In one embodiment, the present invention comprises a dynamic error correction system for a bi-directional digital data transmission system. The transmission system of the present invention includes a transmitter adapted to encode information into a signal. A receiver receives the signal and decodes the information encoded thereon. The signal is transmitted from the transmitter to the receiver via a communications channel, which includes both a transmission channel and a feedback channel. An error rate detector is coupled to the receiver and is adapted to detect an error rate and/or signal quality of the information as the information is received from the transmitter.

In accordance with the present invention, the receiver monitors the quality of received signal in terms of its signal quality, signal strength, and error performance. The receiver and the transmitter are adapted to implement several error correction process of differing strength and capability. The receiver dynamically selects the error correction processes which is best suited to the transmission and reception conditions of the communications channel, the received signal strength from the transmitter, the error performance of the receiver, and the like. The receiver coordinates the selected error correction process with the transmitter by informing the transmitter of its selection via the feedback channel. The transmitter responds by encoding the information on the transmitter side of the communications channel in accordance with the selected error correction process. The receiver uses the selected error correction process to decode the information on the receiver side.

For example, if the error performance on the receiver side of the communications channel is unacceptable, the receiver selects a more powerful, more capable error correction process for both encoding the information on the transmitter side and decoding the information on the receiver side. The transmitter, in accordance with the selected process, includes more redundant error correction code in the signal. This additional error correction code allows the receiver to improve its error performance. In this manner, the receiver adjusts the power of the implemented error correction process to best suit the transmission/reception conditions of the communications channel, the received signal strength, etc. When conditions are bad, more powerful error correction is used. Similarly, when conditions are good, less powerful error correction is used.

In so doing, the amount of bandwidth of the communications channel devoted to transmitting error correction code is tailored to the transmission and reception conditions of the channel. Under high noise, high interference conditions, more channel bandwidth and processor bandwidth is dedicated to error correction than under low noise, low interference conditions. This avoids the inefficiencies associated with static error correction systems of the prior art. In accordance with the present invention, error correction is adjusted according to the observed quality of the communications channel, flexibly adapting the error detection/ correction method according to the observed signal transmission quality. This also saves receiver and transmitter power consumption, as the signal processing load and the total amount of information transmitted corresponds to the observed signal transmission quality.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, a method and system for rapidly achieving synchronization between digital communications systems, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not unnecessarily to obscure aspects of the present invention.

The present invention provides a method which tailors the error correction technique to the channel conditions. The present invention provides a method which dynamically selects the type of error correction required depending upon the circumstances of the communications channel. The method of the present invention adjusts error correction according to the observed quality of the communications channel, flexibly adapting the error detection/correction method according to the observed signal transmission quality. In addition, the present invention dynamically reduces the signal processing load needed for error correction as transmission conditions allow and provides a corresponding reduction in power consumption. The present invention and its advantages are further described below.

Figure 1:
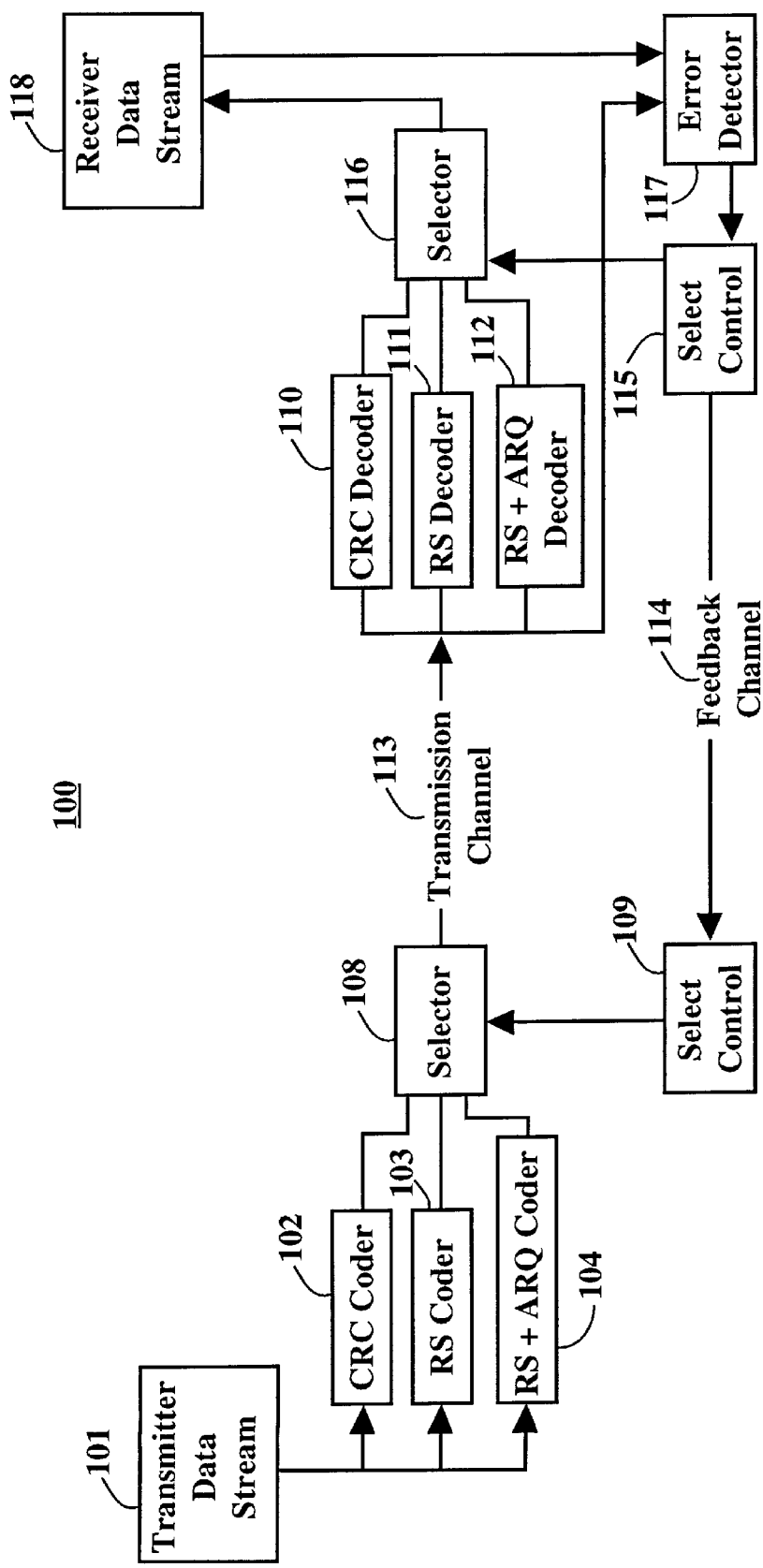
FIG. 1 shows a communication system in accordance with one embodiment of the present invention.

Referring now to FIG. 1, a digital communications system 100 in accordance with one embodiment of the present invention is shown. System 100 is a communications system including a transmitting device and a receiving device. The components of the transmitting device are on the left side of FIG. 1 and the components of the receiving system are on the right side.

Within the transmitting device, a transmitter data stream source 101 is coupled to a CRC encoder 102, an RS encoder 103 and an RS+ARQ encoder 104. Each of the encoders 102–104 are coupled to a selector 108. Selector 108 is coupled to corresponding decoders 110–112 (CRC decoder 110, RS decoder 111, and RS+ARQ decoder 112) in the receiving device via a transmission channel 113. Decoders 110–112 are each coupled to a selector 116, which is in turn coupled to a receiver data stream 118 within the receiving device. In the present embodiment, selector 108 and selector 116 function as switches and are respectively controlled by a select control 109 and a select control 115. An error/signal quality detector 117 is coupled to receiver data stream 118 and the signal from transmission channel 113. Error/signal quality detector 117 is also coupled to select control 115 and select control 109.

System 100 functions by transmitting user data from transmitter data stream 101 to receiver data stream 118 via transmission channel 113. In accordance with the present invention, system 100 dynamically selects the error correction technique used for transmission and reception depending upon the transmission characteristics of the transmission channel 113.

Encoders 102–104 function by encoding error correction code into the information from transmitter data stream 101. Each of encoders 102–104 is designed for a specified level of error correction capability. CRC encoder 102 is a cyclic redundancy check encoder. RS encoder 103 is a Reed-Solomon encoder. RS+ARQ is a Reed Solomon encoder with Automatic Repeat Request capabilities.

In accordance with the present embodiment, information from the transmitter data stream 101 is encoded by each of the encoders 102–104. Selector 109 selects one of encoders 102–104 to provide the signal for transmission channel 113, and in turn, to the receiving device. At the receiving device, the signal is decoded in accordance with which of encoders 102–104 processed the information from the transmitter data stream 101, as selected by selector 116. Selector 116 couples the resulting output to receiver data stream 118.

Although system 100 is depicted with three encoder-decoder pairs, it should be appreciated that the present invention is suited to use with any number of decoder-encoder pairs (e.g., 2 or more), representative of a wide variety of error correction techniques.

The operation of selector 108 and selector 116 is controlled by select control 109 and select control 115 respectively, where select control 109 is slaved to select control 115 via feedback channel 114. The selection is based upon the observed signal quality and detected error rate of the information as received by the receiving device, as determined by error/signal quality detector 117. The receiving device coordinates the selected error correction process with the transmitter by informing the transmitter of its selection via the feedback channel. In accordance with the present invention, select control 115 of the receiving device selects which encoder-decoder pair to use in accordance with the observed error rate/signal quality of the signal received from transmission channel 113.

In the present embodiment, select control 115 determines which encoder-decoder pair to use based upon a detected error rate (e.g., bit error rate) in receiver data stream 118 and the signal quality of transmission channel 113, as determined by error/signal quality detector 117. Error/signal quality detector 117 dynamically determines the error rate in receiver data stream 118 as system 100 operates and select control 115 and 109 dynamically update the currently selected encoder-decoder pair in response thereto. Select control 115 coordinates the selected error correction process with select control 109. Select control 115 communicates with select control 109 via feedback channel 114 in order to coordinate the encoder-decoder pair to be used.

Consequently, the information on the transmitter side of communications channel 113 is encoded in accordance with the decoder selected for the receiver side. The feedback channel is only required to transmit that amount of information necessary to indicate which encoder to use for acceptable signal quality and bit error performance. In this manner, system 100 dynamically adjusts the error correction technique used in response to the error rate in receiver data stream 118. Typically, the error rate is primarily affected by the transmission condition of transmission channel 113.

Referring still to FIG. 1, each of the error correction techniques employed by encoders 102–104 are well known and widely used. The CRC technique employed by encoder 102 is the least powerful of the three, in that it imposes the lowest signal processing load on the transmitting device and the receiving device, imposes the lowest degree of signal processing delay, and is thus suited for use when the transmission quality of transmission channel 113 is good. The RS technique employed by encoder 103 imposes a relatively higher signal processing load and provides more robust error correction than CRC, and is thus suited for use when the transmission quality of transmission channel 113 is degraded or otherwise impaired (e.g., due to weather, due to interference, etc.).

The RS+ARQ technique employed by encoder 104 is the more robust capability wise than both CRC and RS and is capable of functioning when the transmission quality of transmission channel 113 is very degraded. However, RS+ARQ imposes higher signal processing loads than either CRC or RS, and imposes much higher signal processing delay. Hence, RS+ARQ suited for use only when transmission channel 113 is more impaired.

The particular technique (e.g., CRC, RS, RS+ARQ) employed by system 100 depends upon the transmission quality of transmission channel 113. More particularly, the technique employed depends upon the detected bit error rate in the receiver data stream 118 of the receiving device and the quality of the signal received from transmission channel 113. The attributes of the techniques are summarized in Table 1 and the legends for the terms used in the discussions herein are summarized in Table 2 below.

TABLE 1

| detected Signal Quality | Selected Method (ETSI) | Error Detection Method | Error Correction Method | Bandwidth [kbit/s] | Signal processing effort | Signal processing delay | Error correction capability |
| --- | --- | --- | --- | --- | --- | --- | --- |
| Good | LU5 | CRC | | 64 + 16 | Low | Very Low | None |
| Medium | LU8 | | RS | 64 + 4.8 | High | Low | Good |

TABLE 1-continued

| detected Signal Quality | Selected Method (ETSI) | Error Detection Method | Error Correction Method | Bandwidth [kbit/s] | Signal processing effort | Signal processing delay | Error correction capability |
|---|---|---|---|---|---|---|---|
| Bad | LU7 | CRC | RS + ARQ | 64 + 1.6 + 4.8 + 8 | Higher | Very high | Very Good |

TABLE 2

| | |
|---|---|
| LU | Link Usage protocol, as per ETS 300 175-4 or ETS 300 822 |
| CRC | Cyclic Redundancy Check: calculating local check sum and comparing to transmitted check sum to detect errors in received data |
| RS | Reed-Solomon block code forward error correction: using redundancy in the transmitted data to detect and remove errors in received data |
| ARQ | Automatic Repeat reQuest: asking for re-transmission of data received with uncorrectable errors. |

It should be noted that the error correction technique is chosen according to the communication quality actually observed by error/signal quality detector 117. As with conventional communication systems, a basic monitoring of received signal error rate is always required, however in accordance with the present invention, the amount of bandwidth of transmission channel 113 and the amount of processing power devoted to error correction can be selected based upon the observed data error rate required to maintain good communication quality. Therefore, only that amount of signal processing power and associated signal processing delay and other drawbacks of robust error correction (e.g., reduction in the amount of transmission channel 113 bandwidth available for real data, use increase in the power requirements of the transmitting device and the receiving device, increased use of communications spectrum, etc.) that is needed under the operating conditions is incurred.

It also should be noted that the receiving device periodically reassesses and dynamically updates the selected error correction process, and so notifies the transmitting device, on a regular basis during operation. The update rate is typically increased in bad transmission conditions and decreased under good transmission conditions.

In addition, it should also be appreciated that, in accordance with the present embodiment, system 100 is shown using DECT defined (digital enhanced cordless telephony) error correction methods. However, it should be appreciated that the system of the present invention is well-suited for use with other types of digital communication systems.

Thus, as shown by Table 1, the more powerful error correction methods that are employed under bad conditions lead to an increase in transmission delay time. This is caused by additional signal processing required to remove data errors (in case of forward error correction) or even asking for re-transmission in cases where interference is more severe. For most data-type transmissions, this effect is negligible, and in any event, this more graceful degradation is considered more desirable than having the communications link lost (e.g., dropping a wireless telephone call due to bad transmission conditions) which would have been the result with prior art.

For example, in the case of a cellular communication, a slight impairment of the comprehensibility of the communication due to error correction is more tolerable than an abrupt loss of the communications link. A slight impairment of comprehensibility of communication due to the attendant signal processing delay can also be tolerated. In addition, some additional use of spectrum, processing, and battery power is justifiable when transmission conditions are rather bad.

It should be appreciated that the present invention is not required to have symmetrical forward and backward transmission channels. For example, in a full-duplex communication (e.g., A←→B), error correction techniques need not be identical for the directions A→B and B→A. This provides for flexibility in determining the amount of available bandwidth dedicated to error correction. As described above, the feedback channel is only required to transmit that amount of information necessary to indicate what degree of error correction is required for acceptable bit error performance. Hence, the present invention is well-suited to asymmetrical transmission communication systems. As such, the main transmission channel can be allocated the majority of the bandwidth available.

In addition, because the system of the present invention operates in a dynamic manner, a different error correction method can be used in the forward channel than in the backward channel. This is due to the fact that the receiving device can always tell the transmitting device what error correction method is required for the particular transmission conditions. The receiver can determine what bit error rate is acceptable for its particular application.

It should be appreciated that the system of the present invention can alternatively be implemented mostly in software. Although FIG. 1 shows system 100 as being discrete logic blocks, each of these blocks can be implemented in software which executes on a digital signal processor. However, the more robust error correction techniques require more significant processor capacity. For example, the RS technique requires very significant processor bandwidth for execution in real-time. As such, it is common for the RS error correction routines to be implemented as hardware blocks, thereby increasing the speed and responsiveness of the communications system.

For example, in the case of a DECT voice communication systems, the error correction routines and the other components shown in FIG. 1 are typically implemented as software functions which execute on a digital signal processor. The more processor intensive error correction routines execute within specialized hardware accelerators coupled to the processor. For example the RS encoder 103 shown in FIG. 1 would be implemented in hardware, while the other components are software implemented. A software based embodiment of the present invention is shown below.

Figure 2:
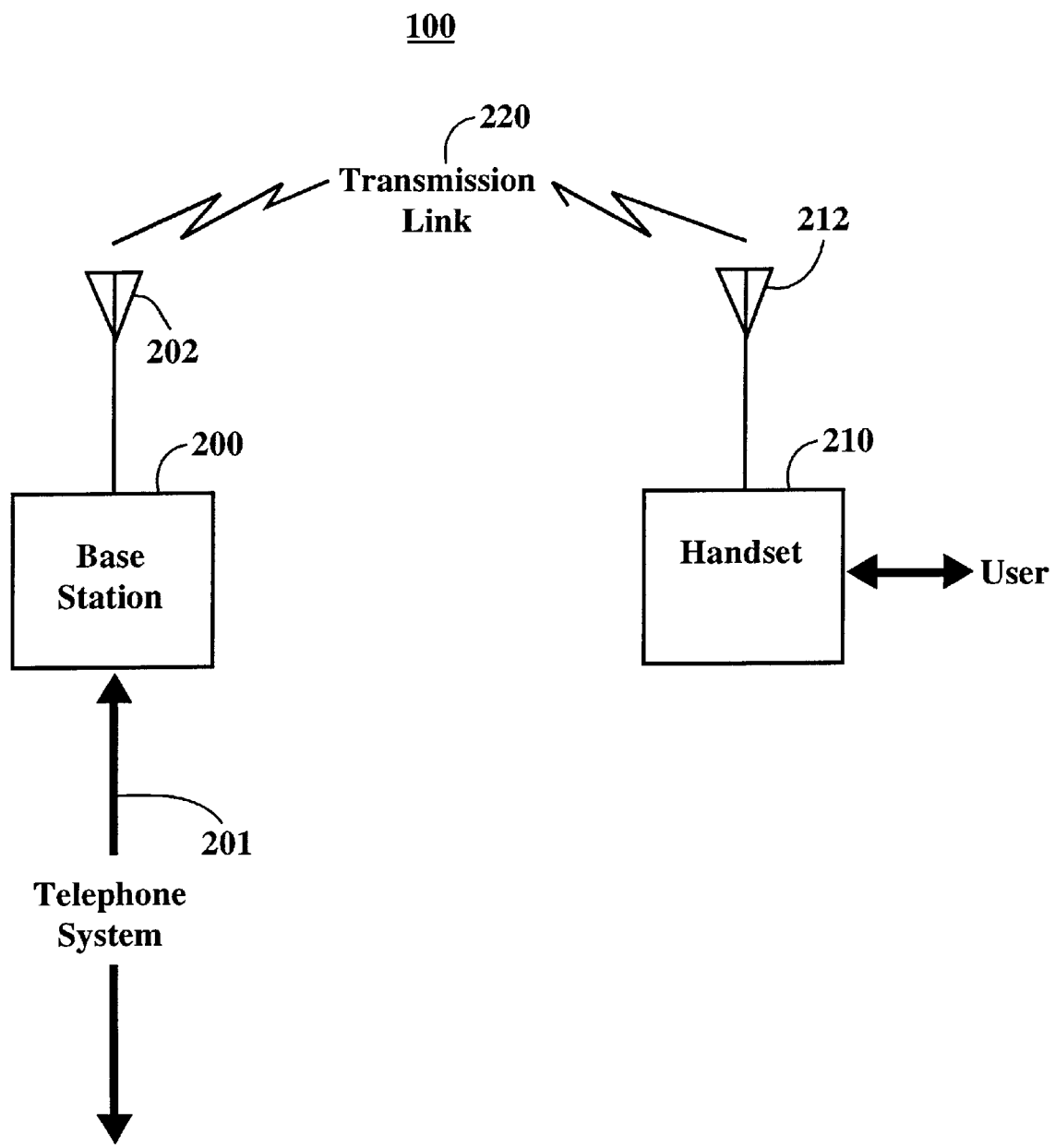
FIG. 2 shows a typical wireless telephone application of the communication system of FIG. 1.

Referring now to FIG. 2, a diagram of an example application of system 100 is shown. FIG. 2 shows a wireless telephone base station and a corresponding telephone handset 210. Base station 200 is coupled to the local telephone exchange via a telephone line 201 (e.g., local loop telephone outlet). Base station 200 communicates with handset 210 via antenna 202 and antenna 212. Handset 210 is a portable wireless handset used for both voice and data communication. Handset 210 communicates with base station 200 via a transmission link 220. As shown in FIG. 2, transmission link 220 includes both transmission channel 113 and feedback channel 114 of FIG. 1, base station 200 includes components 101–109, and handset 210 includes components 110–118.

During operation, system 100 functions by dynamically implementing the optimum error correction technique as suited to the condition of transmission link 220. Thus, as described above, under condition of bad transmission and reception (e.g., where the user takes the handset 210 a relatively long distance away from the base station 200), more demanding error correction is used.

It should be noted that with system 100, many variations and many modifications in accordance with the particular requirements of a user are possible. Such modifications and such requirements may be necessary depending upon the specific circumstances and conditions in which the system of the present invention is to operate and any particular purpose to which the present invention is applied. As such, it is intended that such modifications are within the scope of the present invention.

Figure 3:
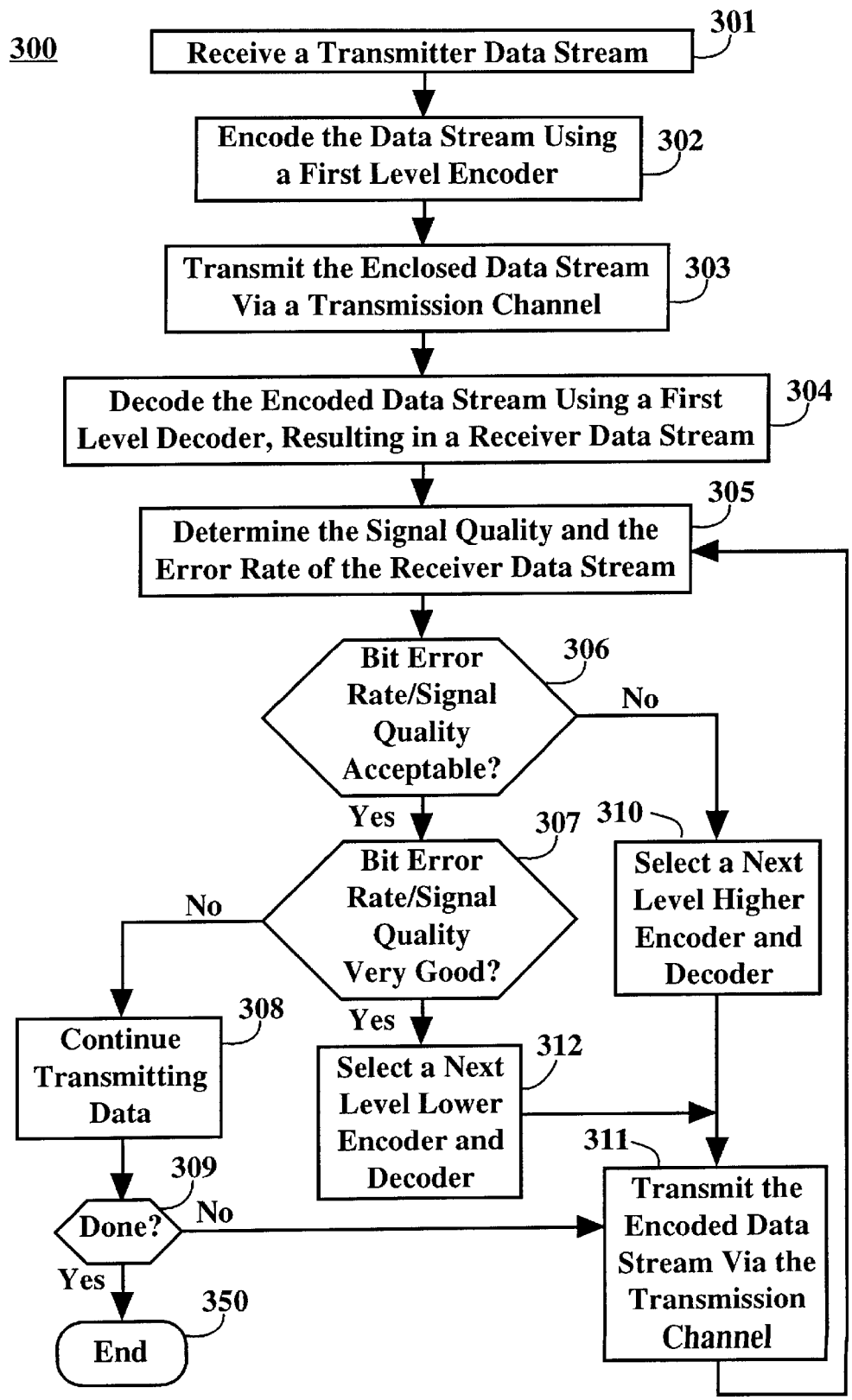
FIG. 3 shows a flow chart of the steps of an operating process in accordance with one embodiment of the present invention.

FIG. 3 shows a flow chart of a process 300 in accordance with one embodiment of the present invention. Process 300 shows the steps of one typical operating process of one embodiment of the present invention (e.g., system 100).

Process 300 begins in step 301 where the system of the present invention receives a transmitter data stream from a user. In the case of a DECT system, this transmitter data stream is comprised of digitized voice information along with some data information.

In step 302, the data stream is encoded for error correction using a first level encoder. The first level encoder encodes the least demanding, least powerful error correction method. Accordingly, this encoder imposes the least power and processing requirements upon the communications system (e.g., system 100). By starting the transmission with the least powerful error correction, the system of the present invention, in this case, begins the communication process assuming transmission conditions will be good. If not, the error correction scheme is dynamically adjusted as described above.

In step 303, the encoded data stream is transmitted via a transmission channel to a receiving device. As described above, since first level error correction is used, spectrum efficiency during the transmission of the data stream is highest.

In step 304, the data stream is received by the receiving device and decoded using a first level decoder. As described above, the first level decoder corresponds to the first level encoder (e.g., they use the same error correction encoding-decoding technique).

In step 305, the signal quality (e.g., signal strength, signal stability, etc.) and the error rate of the receiver data stream is determined. An error/signal quality detector is coupled to the receiver data stream and is adapted to determine the signal quality and the error rate of the information received from the transmitting device (e.g., a bit error rate).

In step 306, the system of the present invention determines whether the signal quality and/or the bit error rate is acceptable. This determination depends upon the particular requirements of the application in which the present invention is used. In the case of voice communications, a more significant error rate is tolerable than with) for example, distributed processing applications (e.g., data modem for a remote client application). If the signal quality/error rate is acceptable, the present invention proceeds to step 307 and continues the data transmission. If the signal quality/error rate is unacceptable, a next higher level encoder and decoder are selected for subsequent transmission.

In step 307, where the bit error rate is acceptable, the system of the present invention determines whether the bit error rate/signal quality is very good. The system determines whether the signal quality/error rate favorably exceeds (e.g., is much better than) the level necessary for desired performance of the system. This allows the system of the present invention to "step down" to a lower level of error correction, and further improve spectrum efficiency and power consumption. Where the signal quality/error rate is very good, process 300 proceeds to step 312. Where the signal quality/error rate is not very good, process 300 proceeds to step 308.

In step 312, where the signal quality/error rate is very good, the system of the present invention selects a next lower level encoder-decoder pair. As described above, the receiving device coordinates the error correction method with the transmitting device.

In step 308, where the signal quality/error rate is acceptable, the data transmission is continued using the encoder-decoder pair currently in use.

Steps 309 and 350 simply show the process of the present invention proceeding back to step 305 and continuing the data transmission until the communication is complete.

In step 310, however, where the signal quality/error rate is not acceptable, as determined in step 306, the system of the present invention selects the next higher level encoder-decoder pair in the transmitting device and the receiving device. As described above, this increases the robustness and capability of the error correction used on the transmitter data stream. Accordingly, this increases the ability of the system to continue successful communication in the presence of noise or interference in the transmission channel. As described above, the receiving device coordinates the error correction method with the transmitting device.

In step 311, the encoded data stream is transmitted to the receiving device. Process 300 then proceeds back to step 305 and determines the bit error rate of the receiver data stream. Step 306 is repeated, and if the error rate is still unacceptable, steps 310 and 311 are repeated, further increasing the capability of error correction. In this manner, the power of the error correction coding is increased until an acceptable bit error rate is achieved. Once an acceptable rate is achieved, steps 305–308 are repeated until the communication is complete. Alternatively, if in step 307 the signal quality and error rate are very good, steps 312 and 311 are executed, reducing the error correction overhead when transmission conditions improve.

Figure 4:
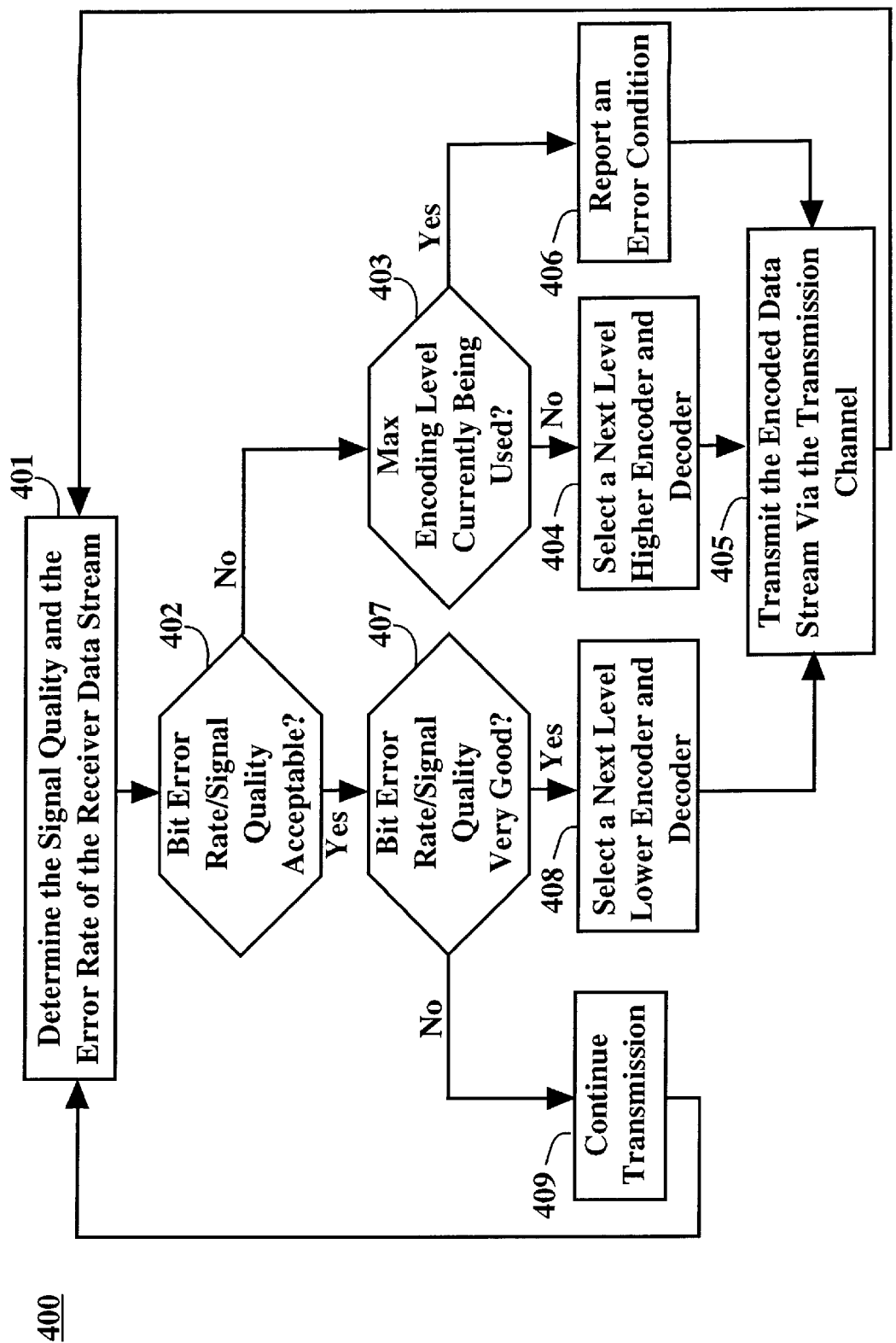
FIG. 4 shows the steps of an alternative operating process in accordance with one embodiment of the present invention.

FIG. 4 shows the steps of a process 400 from a slightly different embodiment of the process of the present invention. Process 400 includes the same steps 301–304 as process 300 of FIG. 3, and hence, these steps are not shown in FIG. 4. However, process 400 includes different steps from step 304 on, and hence, only these steps are shown in FIG. 4, numbered 401–409.

As with process 300, in step 401, process 400 determines the error rate of the receiver data stream.

In step 402, the system of the present invention determines whether the signal quality/error rate is acceptable.

In step 407, the system of the present invention determines whether the signal quality/error rate is very good.

In step 408, where the signal quality/error rate is very good, the system of the present invention selects a next level lower encoder-decoder pair and proceeds to step 405 to transmit the encoded data stream. Otherwise, similar to process 300, process 400 continues transmission in step 409 and proceeds back to step 401.

In step 403, however, if the error rate is not acceptable, the system of the present invention determines whether the maximum encoding level is being used.

In step 406, if the maximum error correction encoding level is being used, the error correction cannot be further increased, and an error condition is reported, although transmission continues.

In steps 404, if the maximum error correction encoding level is not being used, the next higher level error correction encoder-decoder pair are selected, and the resulting encoded data stream is transmitted via the transmission channel.

In step 405 the encoded data stream is transmitted via the transmission channel and process 400 proceeds back to step 401.

As shown in FIG. 4, process 400 includes more detailed steps regarding the dynamic selection of error correction coding than process 300 in that process 400 shows that an error condition is reported if even the highest level of error correction encoding cannot produce acceptable bit error rates. However, the system continues operation. As described above, the receiving device coordinates the error correction method with the transmitting device.

It should be appreciated that many different details of the process of the present invention have been omitted in order to best explain and avoid unnecessarily obscuring aspects of the present invention. The embodiments of process 300 and process 400 are chosen and described in order to best teach the present invention and examples of its application. As described above, many modifications as suited to a particular use are possible, and such modifications are within the scope of the present invention.

Thus, the present invention provides a method which tailors the error correction technique to the transmission conditions. The present invention provides a method which dynamically selects the type of error correction required depending upon the circumstances of the communications channel. The method of the present invention adjusts error correction according to the observed quality of the communications channel, flexibly adapting the error detection/correction method according to the observed signal transmission quality. In addition, the present invention dynamically reduces the signal processing load needed for error correction as transmission conditions allow.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A dynamic error correction system for a bi-directional digital data transmission system, comprising:
   a transmitter adapted to encode information into a signal;
   a receiver adapted to receive said signal and decode said information encoded thereon, wherein said signal is transmitted from said transmitter to said receiver via a communications channel;
   an error rate detector coupled to said receiver, said error rate detector adapted to detect an error rate in said information transmitted from said transmitter;
   a processor coupled to said receiver, said processor adapted to implement at least a first error correction process and a second error correction process for said receiver, wherein said second error correction process is of a higher capability than said first error correction process; and
   said processor coupled to receive said error rate from said receiver via a feedback channel within said communications channel and dynamically select said first error correction process or said second error correction process in response thereto such that error correction employed by said receiver matches the condition of said communications channel, said receiver adapted to use said second error correction process to decode information on said communication channel while said transmitter uses said first error correction process to decode information on said feedback channel.

2. The system of claim 1, wherein said feedback channel is a low capacity channel such that communication between said receiver and said transmitter is asymmetric.

3. The system of claim 1, wherein said second error correction process causes an additional amount of error correction code to be encoded into said information transmitted from said transmitter in comparison to said first error correction process, such that said second error correction process is more resistant to noise in said communications channel than said first error correction process.

4. The system of claim 3, wherein said processor is configured to select said first error correction process when said error rate is in a low state and select said second error correction process when said error rate is in a higher state such that the bandwidth of said communications channel used by said error correction code corresponds to said error rate.

5. The system of claim 3, wherein said processor is configured to select said first error correction process when said error rate is in a low state and select said second error correction process when said error rate is in a higher state such that a processing load for processing said error correction code corresponds to said error rate.

6. The system of claim 3, wherein said processor is configured to select said first error correction process when said error rate is in a low state and select said second error correction process when said error rate is in a higher state such that power consumed while processing said error correction code corresponds to said error rate.

7. A dynamic error correction system for a bi-directional digital data transmission system, comprising:
   a transmitter adapted to encode information into a signal;
   a receiver adapted to receive said signal and decode said information encoded thereon, wherein said signal is transmitted from said transmitter to said receiver via a communications channel;
   an error rate detector coupled to said receiver, said error rate detector adapted to detect an error rate in said information transmitted from said transmitter;
   a first decoder coupled to said receiver, said first decoder adapted to implement a first error correction process for said receiver;

a second decoder coupled to said receiver, said second decoder adapted to implement a second error correction process for said receiver, wherein said second error correction process is of a higher capability than said first error correction process; and a selector coupled to receive said error rate from said receiver via a feedback channel within said communications channel and dynamically select said first decoder or said second decoder for use with said receiver in response thereto such that error correction employed by said receiver matches the condition of said communications channel, said receiver adapted to use said second error correction process to decode information on said communication channel while said transmitter uses said first error correction process to decode information on said feedback channel.

8. The system of claim 7, wherein said feedback channel is a low capacity channel such that communication between said receiver and said transmitter is asymmetric.

9. The system of claim 7, wherein said transmitter and said receiver are a DECT (digital enhanced cordless telephony) based transmitter and receiver.

10. The system of claim 7, wherein said second error correction process causes an additional amount of error correction code to be encoded into said information transmitted from said transmitter in comparison to said first error correction process, such that said second error correction process is more resistant to noise in said communications channel than said first error correction process.

11. The system of claim 10, wherein said selector is configured to select said first decoder when said error rate is in a low state and select said second decoder when said error rate is in a higher state such that the bandwidth of said communications channel used by said error correction code corresponds to said error rate.

12. The system of claim 10, wherein said selector is configured to select said first decoder when said error rate is in a low state and select said second decoder when said error rate is in a higher state such that a processing load for processing said error correction code corresponds to said error rate.

13. The system of claim 10, wherein said selector is configured to select said first decoder when said error rate is in a low state and select said second decoder when said error rate is in a higher state such that power consumed while processing said error correction code corresponds to said error rate.

14. A method for a dynamic error correction system for a bi-directional digital data transmission system, the method comprising the steps of:

a) transmitting a signal having information encoded thereon using a transmitter;

b) decoding said signal to obtain said information using a receiver, wherein said receiver receives said signal via a communications channel;

c) detecting an error rate in said information using an error detector coupled to said receiver;

d) implementing a first error correction process for said receiver when said error rate is in a low state;

e) implementing a second error correction process for said receiver when said error rate is in a higher state, wherein said second error correction process is of a higher capability than said first error correction process, the state of said error correction process detected via a feedback channel within said communications channel; and f) dynamically selecting said first error correction process or said second error correction process in response to said error rate such that error correction employed by said receiver matches the condition of said communications channel, wherein said receiver is adapted to use said second error correction process to decode information on said communication channel while said transmitter uses said first error correction process to decode information on said feedback channel.

15. The method of claim 14, further including the steps of:

g) detecting a signal quality of said information using a signal quality detector coupled to said receiver;

h) implementing a first error correction process for said receiver when said signal quality is in a low state;

i) implementing a second error correction process for said receiver when said signal quality is in a higher state, wherein said second error correction process is of a higher capability than said first error correction process; and j) dynamically selecting said first error correction process or said second error correction process in response to said signal quality such that error correction employed by said receiver matches the condition of said communications channel.

16. The method of claim 14, wherein said second error correction process causes an additional amount of error correction code to be encoded into said information transmitted from said transmitter in comparison to said first error correction process, such that said second error correction process is more resistant to noise in said communications channel than said first error correction process.

17. The method of claim 16, further including the step of:

implementing said first error correction process or said second error correction process in response to said error rate such that the bandwidth of said communications channel used by said error correction code corresponds to said error rate.

18. The method of claim 16, further including the step of:

implementing said first error correction process or said second error correction process in response to said error rate such that a processing load for processing said error correction code corresponds to said error rate.

19. The method of claim 16, further including the step of:

implementing said first error correction process or said second error correction process in response to said err or rate such that power consumed while processing said error correction code corresponds to said error rate.

* * * * *